United States Patent [19]

Chen

[11] 4,414,507
[45] Nov. 8, 1983

[54] COPPER EMBEDDED FERRITE COIL ARRANGEMENT FOR SUPPLYING UNIFORM ROTATING FIELD IN FULL FREQUENCY RANGE FOR TESTING MAGNETIC BUBBLE DEVICES

[75] Inventor: Thomas T. Chen, Placentia, Calif.

[73] Assignee: Rockwell International Corporation, El Segundo, Calif.

[21] Appl. No.: 191,546

[22] Filed: Sep. 29, 1980

[51] Int. Cl.³ ...................... G01R 33/12; G11C 19/08
[52] U.S. Cl. .................................. 324/210; 324/228; 365/1
[58] Field of Search ............... 324/210, 211, 228, 232, 324/234, 238, 239–243, 260, 261, 262; 365/1, 2, 6, 7, 27, 28

[56] References Cited

U.S. PATENT DOCUMENTS

| | | | |
|---|---|---|---|
| 2,810,880 | 10/1957 | Buccicone | 324/260 X |
| 2,958,037 | 10/1960 | Riede et al. | 324/262 |
| 3,362,002 | 1/1968 | Sedlak et al. | 324/260 X |
| 3,371,272 | 2/1968 | Stanton | 324/207 |
| 3,931,618 | 1/1976 | Lacey | 365/2 |
| 3,996,510 | 12/1976 | Guichard | 324/236 X |
| 4,213,091 | 7/1980 | Cooper | 324/210 |

FOREIGN PATENT DOCUMENTS 6443 1/1980 European Pat. Off. ............... 365/6

Primary Examiner—Gerard R. Strecker
Attorney, Agent, or Firm—H. Fredrick Hamann; Daniel R. McGlynn; Randall G. Wick

[57] ABSTRACT

A coil arrangement for testing magnetically operative devices comprising means for mounting a magnetically operative device to be tested by an external magnetic field; first and second coil means disposed symmetrically with respect to the place of the device, the coil means functioning to produce an external magnetic field for testing the device; characterized in that the first coil means is embedded within a metallic electrically conductive body for confining the magnetic field lines to a predetermined region.

15 Claims, 7 Drawing Figures

COPPER EMBEDDED FERRITE COIL ARRANGEMENT FOR SUPPLYING UNIFORM ROTATING FIELD IN FULL FREQUENCY RANGE FOR TESTING MAGNETIC BUBBLE DEVICES

FIELD OF THE INVENTION

The invention relates to magnetic bubble domain devices, and in particular to equipment for testing such devices.

BACKGROUND OF THE INVENTION

In the field access bubble memory device, a uniform rotating field is required for moving the bubbles around the circuit. For the packaged device, this field is normally generated by two orthogonally arranged flat solenoid coils. In the case when a whole wafer has to be tested before dicing into small devices, the flat solenoid approach is not applicable because it restricts both the electrical and mechanical access to the wafer. Therefore, an open coil structure which has no physical restriction on the wafer plane is required.

There are numerous applications needing a uniform field in an open space, such as bubble wafer probings, wafer visual inspection, and testing for a bubble chip bounded in a chip carrier. Prior to the present invention there has not been a small, efficient coil configuration to meet such requirements.

References

1. R. G. Wolfshagen, J. E. Ypma, G. W. Murray and T. T. Chen "Uniform Rotating Field Network Structure to Efficiently Package A Magnetic Bubble Domain Memory" U.S. Pat. No. 4,106,106.
2. H. Macgawa. J. Matusuda and M. Takasu, "Flat Packaging of Magnetic Bubble Devices", IEEE Trans. on Mag., MAG-11, pp. 1151-1153, (1975).

The novel features which are considered as characteristic for the invention are set forth in particular in the appended claims. The invention itself, however, both as to its construction and its method of operation, together with additional objects and advantages thereof will be best understand from the following description of specific embodiments when read in connection with the accompanying drawings.

BRIEF DESCRIPTION OF THE DRAWING

In the various figures, like reference numerals refer to like elements.

DESCRIPTION OF THE PREFERRED EMBODIMENT

The invention is concerned with an open ferrite coil arrangement such as for the testing of magnetic bubble domain devices.

There are currently three different approaches being used to achieve open coil structures. They are ferrite plate coil, the ferrite frame coil and flat face coil. FIG. 1 shows an example of the ferrite frame coil design.

Figure 1A:
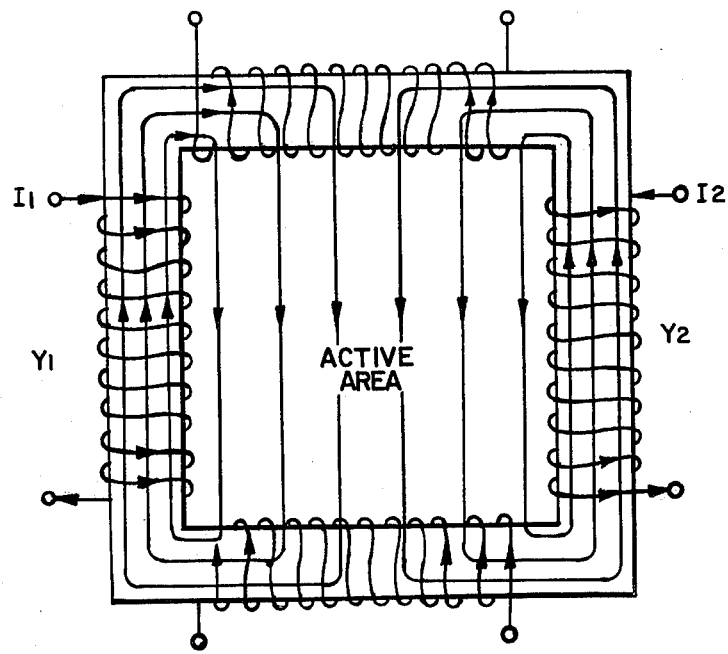
FIG. 1(a) is a top view of a symmetric ferrite frame coil as is known in the prior art.

FIG. 1(a) illustrates the principle of the ferrite frame coil as known in the prior art where two coils Y1 and Y2 wound on two opposite legs of the ferrite frame generate magnetic field in the same direction. When these fluxes meet in the horizontal arms, they are forced to flow access the center gap of the frame. With another pair of coils wound on the two horizontal arms, an inplane rotating field can be generated.

Figure 1B:
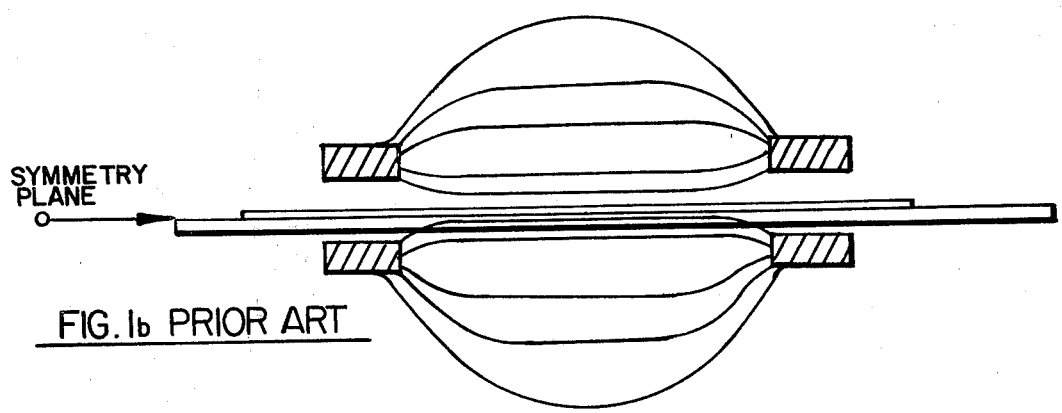
FIG. 1(b) is a cross-section of the ferrite frame coil shown in FIG. 1(a).

To create a uniform field in an open plane, two sets of frame coils are placed in parallel position as illustrated in FIG. 1(b). A uniform horizontal rotating field can be achieved in the symmetry plane of these two coil sets.

Figure 2:
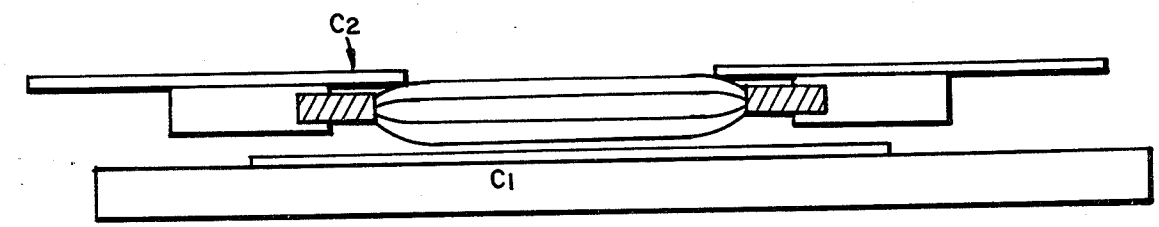
FIG. 2 is a copper reflective frame coil as is known in the prior art.

This arrangement can generate uniform field but needs a driver with large voltage and current capability or voltage current product (VI) capability, because of the large coil volume over which the magnetic flux has to be filled. To reduce the coil volume, the coil inductance and the VI requirement of the coil driver, a copper reflection technique is used as illustrated in FIG. 2. A copper base plate $C_1$ is used in place of the second ferrite frame. At high frequency, the copper plate reflects the magnetic flux such that it acts like an image of the second ferrite frame coil. The field uniformity and sensitivity is maintained, but the coil volume is reduced by half. To further reduce the coil volume, a second copper plate $C_2$ can be added to the other side of the ferrite frame to restrict the leakage flux.

This arrangement has until now been suitable to supply the rotating field for use in bubble wafer probers and visual inspection coil sets. However, it has some limitations on performance:

First, the copper plate reflects the magnetic field due to the eddy current effect. Its reflecting efficiency drops with the lowering of operating frequency and has no effect at d.c. To simulate a start-stop operating mode on the wafer prober, the coil can only be turned off for a very short period.

Second, at d.c. field condition, the image coil induced by the copper reflection does not exist. Therefore, the device is no longer in the magnetic symmetry plane. Any external in-plane field applied to the wafer will induce a vertical field component. Therefore, no d.c. holding field can be applied to the wafer to stabilize the bubble position as in the conventional device package. To operate the device properly, a pseudo-holding-field is used by leaving a residue current in the coil when the rotating field is turned off. This arrangement does not really simulate the final device package environment.

Third, the coil holder in the prior art designs is made of non-metallic material such as expoxiglass or bakelite. These materials are not good heat conductors and make the cooling of the coil difficult.

The copper embedded symmetrical coil structure according to the present invention is illustrated in FIG. 3. It consists of two coil sets 10 and 11 arranged symmetrically with respect to the device plane 12. One of the coils 11 is fully embedded in a copper plate 13, while the other one 10 is enclosed by the copper holder 14 but with the region facing the device active area exposed. In the case of using ferrite frame coils for wafer probing of visual inspection applications, the center access hole 16 of the exposed coil set is also left open for mechanical access of the probe card needles or viewing microscope objectives. At high frequency, the magnetic field generated by the embedded coil set is completely confined inside the coil. The magnetic field in that actual device area is supplied by the exposed coil set. The coil then behaves exactly the same as the reflection coil shown in FIG. 2. At d.c. or low frequency, the copper plates are not reflecting. The device is placed in the symmetrical plane and the coil behaves similar to the coil illustrated in FIG. 1. Therefore, the start-stop restriction encountered in the reflection coil design is eliminated.

Since the coil is magnetically symmetrical with respect to the wafer, a d.c. holding field can be superimposed by adding d.c. current to the drive coils or by applying additional external inplane field. The device in the active area then sees a magnetic field environment which is exactly the same as that in the device package.

The coil holders 13 and 14 themselves are all made of copper. This arrangement minimizes the leakage field from the coil and reduces the coil inductance to a minimum. Using solid copper plates 13 and 14 also offers a low resistive path for the induced eddy current and thus reduces power dissipation in the copper plates. The copper plates 13 and 14 are also good heat conductors. By providing cooling channels 15 and 17 inside the plate and passing through coolants, the heat generated by the coil can be easily removed.

Figure 3A:
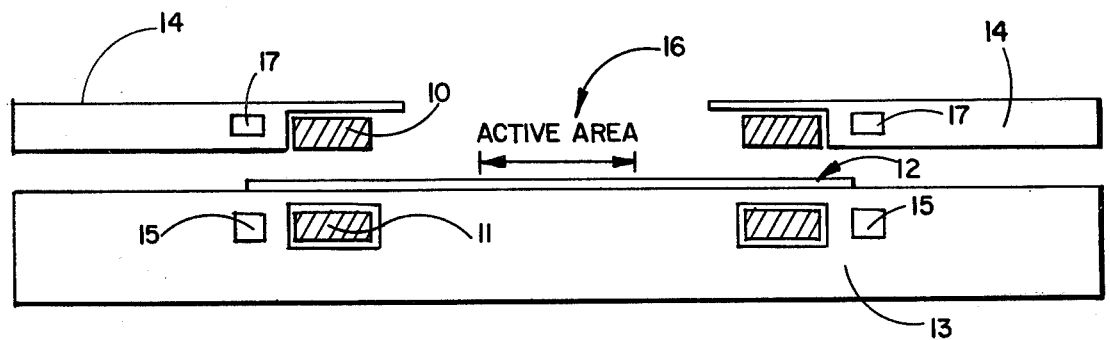
FIG. 3(a) is a copper embedded ferrite frame coil according to the present invention.
Figure 3B:
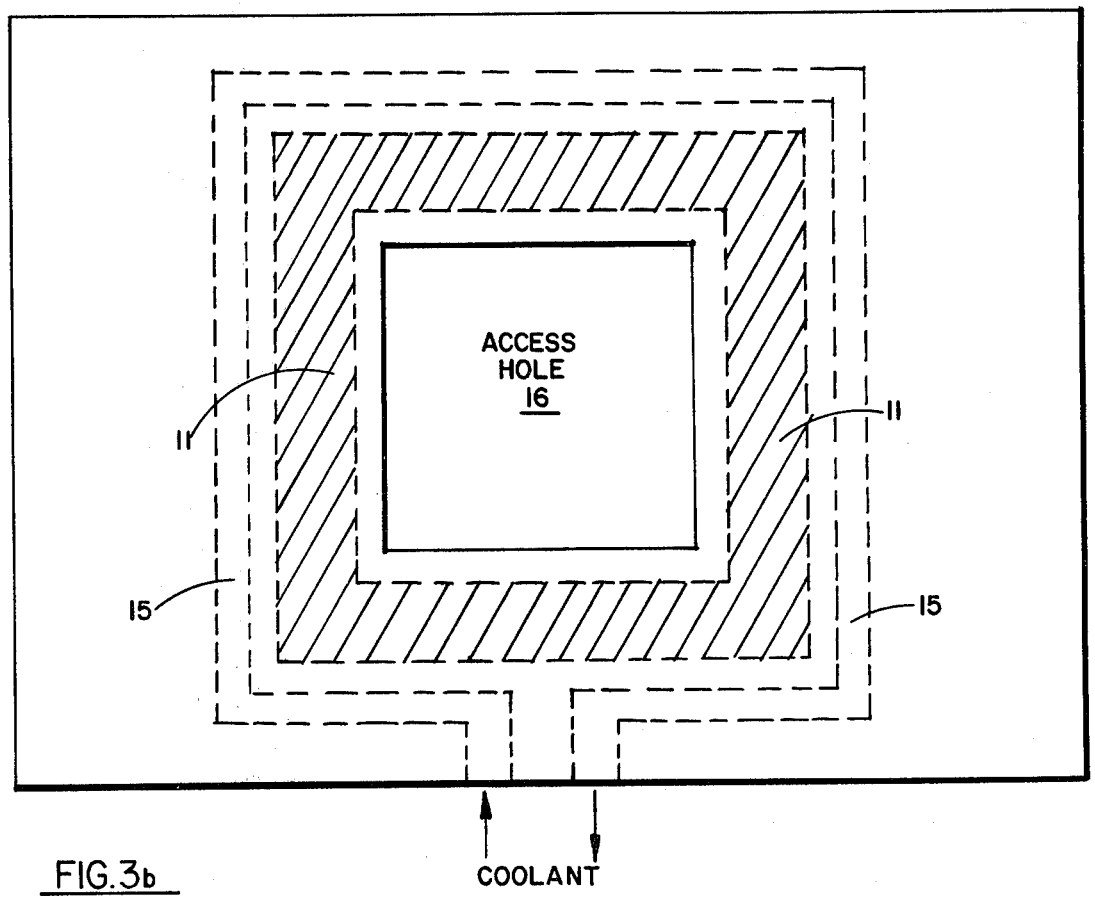
FIG. 3(b) is a top view of the copper embedded ferrite frame coil shown in FIG. 3(a)

Using this coil structure of FIG. 3(a) and 3(b), all three restrictions observed in the prior art reflection coil structure are eliminated. This coil also works more efficiently because of the low inductance and lower eddy current loss.

Figure 4A:
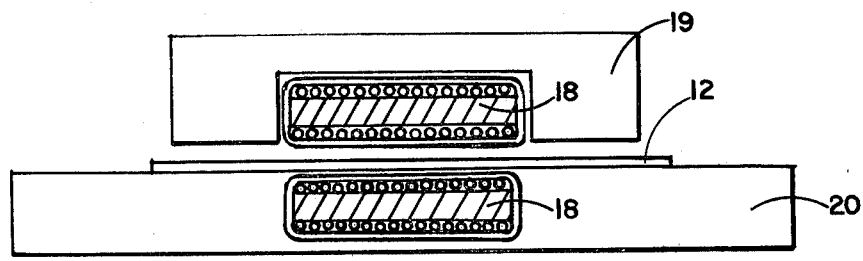
FIG. 4(a) is a second embodiment of the copper embedded ferrite plate coil according to the present invention.
Figure 4B:
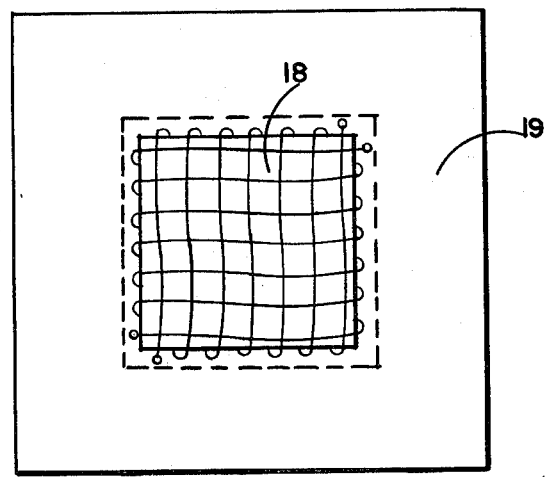
FIG. 4(b) is a top view of the copper embedded ferrite plate coil according to the present invention.

The same principle of the present invention can be extended to flat face coil structure and ferrite plate coil structure. FIGS. 4a and 4b illustrate a modification for a ferrite plate structure 18. This structure provides a field distribution closer to that in the flat solenoid coil than the ferrite frame coil. Since there is no hole in the ferrite plate embodiment of FIG. 4 all the electrical access to the device under test must be made between the two copper holders 19 and 20.

In summary, the present invention provides three new features:

First, a two coil pair structure is placed in symmetry with respect to the device plane. One coil is exposed toward the device and another is fully embedded inside a metal, preferably copper, body. At d.c. or low frequency signal applied to the coils, the two coils provide a uniform field in the symmetry plane. At high frequency, only the exposed coil works in the same manner as the reflected coil structure. The magnetic field from the embedded coil is completely shielded by the metal body. The coil set according to the present invention can thereby generate a uniform rotating field from d.c. to the highest operating frequency.

Second, both coils are surrounded by metal plates except the space between the device plane and the exposed part of the coil set. Such an arrangement minimizes the volume of the coil, thus keeping the coil inductance and the driver voltage-current product to a minimum.

Third, extensive amount of metal is used around the coil to reduce the eddy current loss and provide a good heat sink for the coil. Therefore, the coil can be operated more efficiently than the conventional open coil structure of the prior art.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

I claim:

1. A coil arrangement for testing magnetically operative devices comprising:
   means for mounting a magnetically operative device to be tested by an external magnetic field;
   first and second coil means disposed symmetrically with respect to the plane of said device, with said first and second coil means on opposite sides of the plane of said device, said coil means functioning to produce an external magnetic field between said first and second coil means by producing magnetic lines which extend along said plane of said device for testing said device;
   characterized in that said first coil means is embedded within a metallic electrically conductive body for confining the magnetic field lines to a predetermined region along said plane of said device, so that at low magnetic field frequencies, said first and second coil means cooperate together to produce said external magnetic field, and so that at high magnetic field frequencies, said second coil means produces a magnetic field reinforced by a reflected magnetic field from said electrically conductive body for producing said external magnetic field.

2. A coil arrangement as defined in claim 1 characterized in that said magnetically operative device is a magnetic bubble domain device.

3. A coil arrangement as defined in claim 1 characterized in that said first and second coil means comprise ferrite from coils wound in the shape of a substantially square doughnut.

4. A coil arrangement as defined in claim 1 characterized in that said first and second coil means comprise flat ferrite plate coils having a substantially square shape.

5. A coil arrangement as defined in claim 4 characterized in that said ferrite plate coils are disposed substantially parallel to each other.

6. A coil arrangement as defined in claim 4 characterized in that said second coil means is embedded within an electrically conductive body so that only one of said flat faces of said ferrite plate coil is exposed.

7. A coil arrangement as defined in claim 1, further comprising a cooling channel disposed in said body for the transport of a cooling fluid therethrough which functions to cool said body.

8. An apparatus for the testing of a magnetic bubble device using a variable frequency signal generator which produces a testing field signal for moving magnetic bubbles in the device, said apparatus comprising:
   a first magnet means responsive to said testing field signal for producing a first magnetic flux,
   a second magnet means responsive to said testing field signal for producing a second magnetic flux, said second magnet means located adjacent to said first magnet means so that said magnetic bubble device may be removably positioned between said first and second magnet means for testing, so that said first and second magnet means are on opposite sides of the plane of said device, and so that said first and second magnetic flux pass through said magnetic bubble device during testing, with the first and second magnet means arranged to produce a rotating magnetic flux in the plane of said magnetic bubble device for moving the bubbles in the device, a conducting means located adjacent said second magnet means and positioned between said second magnetic means and said magnetic bubble device during testing, said conducting means being electrically conductive and positioned so that when the frequency of said testing field signal is high enough to induce substantial eddy currents in said conducting means, said eddy currents produce an induced magnetic flux which reinforces said first magnetic flux in passing through said magnetic bubble device, and so that when the frequency of said testing field signal is low enough so that no substantial eddy currents are produced in said conducting means, said conducting means does not substantially interfere with said second magnetic flux which reinforces said first magnetic flux in passing through said magnetic bubble device.

9. The apparatus of claim 8, wherein said first magnet means comprises a substantially planar, electrically conductive member having a centrally located hole passing therethrough and having a plurality of electromagnet coils mounted on said member about said hole and for producing said first magnetic flux in response to said testing field signal, so that said hole allows electrical and mechanical access therethrough to said magnetic bubble device during testing.

10. The apparatus of claim 9, wherein said first magnet means is mounted to said conducting means so that during testing, said magnetic bubble device is between said first magnet means and said conducting means, thus holding said magnetic bubble device in place for test probing through said hole.

11. The apparatus of claim 9, wherein said electrically conductive member is thermally conductive and is provided with a cooling channel therethrough so that coolants may be passed through said member in order to remove heat produced by said plurality of electromagnet coils.

12. The apparatus of claim 8, wherein said conducting means is thermally conductive and substantially surrounds said second magnet means so that heat is dissipated away from said second magnet means and thermal damage to said second magnet means is prevented.

13. The apparatus of claim 12, wherein said conducting means is provided with a cooling channel therethrough so that coolants may be passed through said conducting means in order to remove heat generated by said second magnet means.

14. A copper embedded symetrical coil structure for the testing of a magnetic bubble domain device comprising:
a copper plate;
a rectangular, copper holder frame mounted above said plate and spaced away from said plate so that said bubble device fits horizontally therebetween, said holder frame having a rectangular shape with a central rectangular open region;
a first coil set assembly having a first pair of wire coils wound on opposite sides of a first rectangular ferrite core loop, with said first coil set assembly fully embedded into the underside of said copper plate; and
a second coil set assembly having a second pair of wire coils mounted on opposite sides of a second rectangular ferrite core loop, with said second coil set assembly mounted to the underside of said holder frame and surrounding said rectangular open region so that said second ferrite core is positioned on the periphery of said rectangular open region, and so that the underside of said second coil assembly is exposed to said magnetic bubble domain device when said magnetic bubble domain device is in place between said copper plate and said rectangular copper holder frame.

15. A copper embedded symetrical coil structure for the testing of a magnetic bubble domain device comprising:
a copper plate;
a rectangular, copper holder frame mounted above said plate and spaced away from said plate so that said bubble domain device fits horizontally therebetween, said holder frame having a rectangular shape with a rectangular recess on the underside thereof;
a first coil set assembly having a first pair of wire coils wound on opposite sides of a first rectangular ferrite core plate, with said first coil set assembly fully embedded into the underside of said copper plate; and
a second coil set assembly having a second pair of wire coils wound on opposite sides of a second rectangular ferrite core plate, with said second coil set assembly mounted inside said recess on the underside of said holder frame, so that the underside of said second coil set assembly is exposed to said magnetic bubble domain device when said magnetic bubble domain device is in place between said copper plate and said holder frame.

* * * * *